United States Patent [19]

Wuidart

[11] Patent Number: 5,270,562
[45] Date of Patent: Dec. 14, 1993

[54] LOCKING DEVICE WITH A NEVER-PROGRAMMABLE FLOATING GATE CELL

[75] Inventor: Sylvie Wuidart, Pourrieres, France

[73] Assignee: SGS-Thomson Microelectronics S.A., Gentilly, France

[21] Appl. No.: 794,616

[22] Filed: Nov. 15, 1991

Related U.S. Application Data

[63] Continuation of Ser. No. 578,199, Sep. 6, 1990, abandoned.

[30] Foreign Application Priority Data

Sep. 7, 1989 [FR] France ................ 89 11705

[51] Int. Cl.⁵ ............................................. H01L 29/68
[52] U.S. Cl. ...................................... 257/315; 257/322; 257/175; 257/435
[58] Field of Search ................ 357/13, 84, 23.5, 175, 357/315, 322, 435

[56] References Cited

U.S. PATENT DOCUMENTS

| | | | |
|---|---|---|---|
| 4,744,062 | 5/1988 | Nakamura et al. | |
| 4,805,138 | 2/1989 | McElroy et al. | 357/84 |
| 4,835,111 | 5/1989 | Wright et al. | 357/13 |

FOREIGN PATENT DOCUMENTS 8800372  1/1988  PCT Int'l Appl. .

Primary Examiner—Edward Wojciechowicz

[57] ABSTRACT

Locking devices are made by using a floating gate cell which is put into a state of being never programmable electrically by placing a voltage limiter between its drain zone and the ground and between its source zone and the ground. The cell can no longer ever be programmed by ultra-violet rays because of the interposition of a metal pad above its control gate. A voltage limiter is made by using a Zener diode made by the joining, to the drain and source zones, of a zone with opposite doping, placed outside the channel zone and connected to the ground.

4 Claims, 1 Drawing Sheet

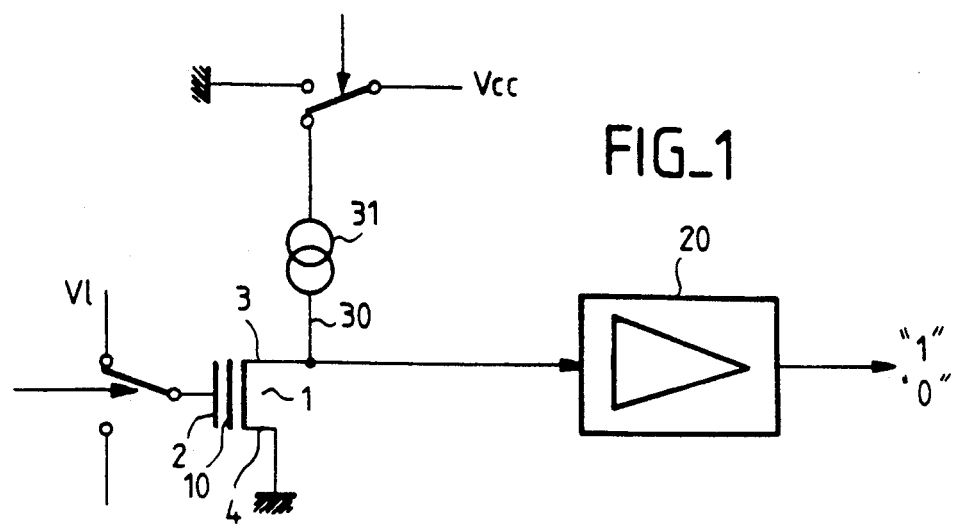
FIG_1
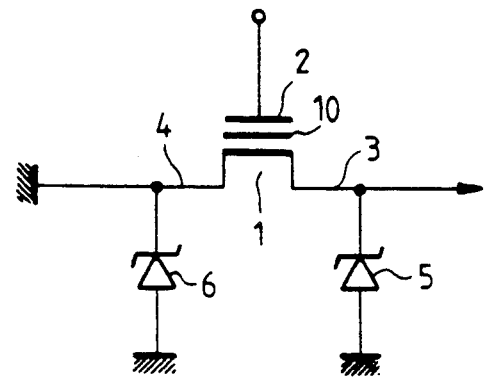
FIG_2-a
FIG_2-b
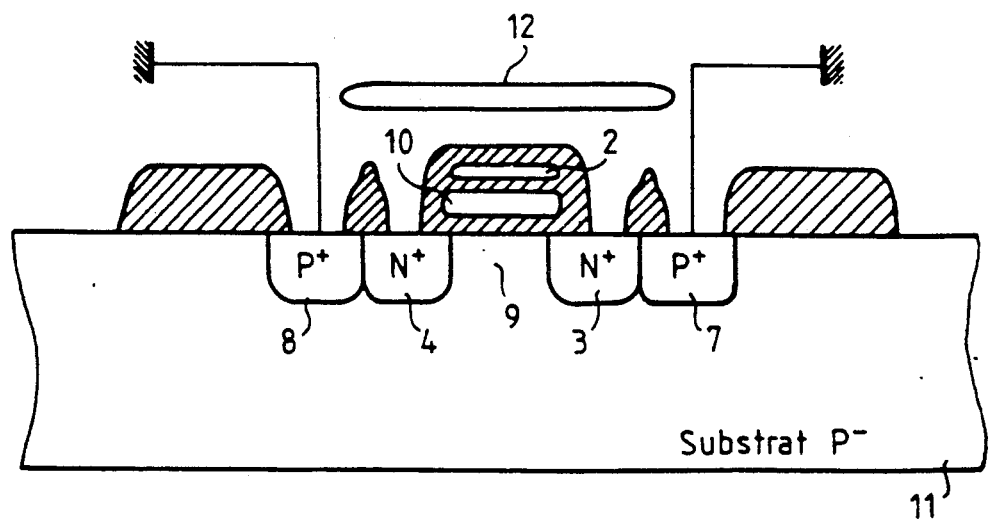

LOCKING DEVICE WITH A NEVER-PROGRAMMABLE FLOATING GATE CELL

This application is a continuation of Ser. No. 07/578,199 filed on Sep. 6, 1990 now abandoned.

BACKGROUND OF THE INVENTION

1. Field of the Invention

The present invention provides an irreversible device for preventing access to an integrated circuit, which can be used in every field where it is necessary, to irreversibly prohibit access to certain zones or functions of the integrated circuit.

This device is particularly important for restricting the internal accessibility of an integrated circuit after tests, when it leaves the production line. Indeed, after manufacture, an integrated circuit has to be tested comprehensively to an extent which it is constantly improving. In particular, the internal accessibility of the integrated circuit must be the maximum during the test. However, this accessibility must thereafter be restricted, for a user of the circuit should have access, after these tests, only to a so-called applicative layer. It is therefore necessary to prohibit certain paths of access.

Also, a user of a programmable integrated circuit should be able to adapt this integrated circuit to a particular purpose with the programming of an application. It may then be particularly important to prohibit modifications, or even the external reading, of the pieces of information contained in certain memory zones. It may also be important to take precautions against external disturbances, if any, that might affect these memory zones. Locking devices enable such protection. These devices are, for example, required in integrated circuits provided with security systems, such as the circuits of computerized money products.

2. Description of the Prior Art

In the prior art, when these locking devices leave the production line, they are in an unlocked state and are equivalent to closed switches. These devices are programmable only once, irreversibly. Once programmed, after the tests, they are equivalent to open switches. These devices are even integrated into the circuit, so that there is no possibility of short-circuiting them again. Their states are taken into account in the logic equations of access to the memory zones or the functions that they control.

There are known programmable devices with programmable fuses. Each fuse, made for example on a very thin layer of polycrystalline silicon, is supplied with current by a transistor. When a current flows for a certain time, local heating occurs, prompted by the very thin section of the fuse. This heating is enough to make the metal vaporize and the fuse is said to be burnt out. In fact, sometimes the fuse does not get burnt out. In practice, a device with fuses is not very reliable.

SUMMARY OF THE INVENTION

The invention, therefore, is aimed at making a locking device that does not have this drawback. It uses known characteristics of the EEPROM cells which will now be recalled.

An EEPROM cell is an electrically erasable and programmable cell. It has a floating gate transistor. The floating gate, interposed between a control gate of the transistor and a conduction channel zone of the transistor, may receive electrical charges. These charges may enforce a state of conduction of the transistor that is independent of a command applied to the control gate. In an EEPROM cell, the electrical charges are injected into the floating gate by the application of a strong electrical field. Such a cell has the particular feature of having a zero threshold voltage when it leaves the production line. It is a virgin cell. It may be recalled that the threshold voltage is the minimum voltage, in terms of absolute value, that must be applied to the control gate so that a conduction channel is formed in the channel zone. An EEPROM cell, with an N type channel, has a positive threshold voltage, of the order of 5 volts if the cell is erased. If the cell is programmed, its threshold voltage is negative, of the order of −2 volts.

The memory cell reading circuits have a selection circuit that applies a control pulse to the control gate of the transistors of the memory cells of each line. For a standard gate voltage value, of the order of 1.5 volts, the EEPROM cell described conducts current when it is programmed, for a gate voltage greater than its threshold voltage is applied to it. The EEPROM cell conducts no current when it is erased.

In the invention, advantage is taken of the fact that the EEPROM cell, when in the virgin state, behaves as if it were programmed. Hence, in the invention, steps have been taken to prohibit the programming of the EEPROM cell. Under these conditions, it conducts current only if it is in the virgin state. Once erased, it no longer conducts current. Since it can no longer be programmed, it remains in this state. Thus we have the desired locking device.

An object of the invention, therefore, is to provide a device for locking access to all or a part of an integrated circuit, wherein said device comprises a never-programmable floating gate cell.

The characteristics of an EEPROM cell according to the invention are given in the following description, which is made with reference to the appended drawings. This description and these figures are given purely by way of example and in no way restrict the scope of the invention.

DESCRIPTION OF THE FIGURES

FIG. 1 shows an example of a locking device, provided with an EEPROM cell according to the invention;

FIG. 2.a shows an equivalent electrical diagram of an EEPROM cell according to the invention;

FIG. 2.b shows a schematic sectional view of a cell according to FIG. 2.a.

DESCRIPTION OF A PREFERRED EMBODIMENT

FIG. 1 shows a locking device according to the invention. An EEPROM cell 1 has a source zone 4 connected to the ground. A drain zone 3 is supplied by a bias current generator 31 controlled by a selection circuit of the cell. In a dual technology, the respective roles of the source and drain zones will be inverted. A reading voltage V1, controlled by a selection circuit, that is not shown, is applied to the control gate 2 of the EEPROM cell. The cell is, for example, selected by the decoding of a basic address of a memory zone that it protects. A reading voltage in the range of 1.5 volts is then applied to the gate 2. Before the selection, a bit line 30, to which the cell is connected, is supplied by a current generator 31 at a voltage in the range of 5 volts. A reading circuit (or sense amplifier) 20, centered on a threshold voltage ranging between 0 and 5 volts (generally, the mean value of 2.5 volts is taken), detects a "1" if the cell is in the virgin state and a "0" if the cell is erased. Indeed, if the cell is in the virgin state, its threshold voltage is equal to "0" bolt. At the time of selection, it behaves like a closed circuit. Under these conditions, the voltage on the bit line 30 drops. This drop is detected in the circuit 20. By contrast, if the cell 1 has been erased, it behaves like an open circuit, irrespectively of the command applied. There is then no longer any voltage drop detected. It is the information at output of the circuit 20 that validates or does not validate the decoding of the memory zone.

It is thus possible to have a non-programmable EEPROM memory block in an integrated circuit, each cell locking a particular function.

FIGS. 2.a and 2.b show a never-programmable EEPROM cell acording to the invention. The EEPROM cell 1 is controlled at its control gate 2 by a voltage V1. Between the drain zone 3 and the ground, there is a voltage limiter 5 which limits the voltage between the drain and the ground to 5 volts. Between the source zone 4 and the ground, there is another voltage limiter 6 which plays the same role. In FIG. 2b, the drain zone 3 and the source zone 4 are regions with a given type of doping, for example N type doping, in a substrate of the opposite type, for example of the P type. The voltage limiter 5 or 6 respectively is a Zener diode made preferably (FIG. 2.b) by the joining to the drain zone 3, source zone 4, respectively, of a zone 7, 8 respectively, with opposite doping, outside the channel zone 9. The doping zones 7 and 8 are connected to the ground. The zones 7 and 8 have a doping of the same type as that of the substrate 11. If the cell is made in a well, the zones 7 and 8 are doped with impurities of a same type as that of the trench in which the cell is made. Moreover, these zones have to be more highly doped than the substrate, or the trench as the case may be.

In the example of FIG. 2.b, the zones 7 and 8 are P doped.

To explain the physical phenomena brought into play, we must recall the principles of erasure and programming of an EEPROM cell.

Take, for example, an EEPROM cell with an N type channel zone. This cell 1 is erased by putting its control gate 2 at a highly positive potential, of the order of 15 volts or more, and by grounding its drain zone 3. Electrons are trapped beneath the floating gate under the effect of a powerful electrical field thus created. They induce a potential barrier that counters the formation of a conduction channel in the channel zone 9: the threshold voltage of the cell is increased. Typically, the threshold value takes on a value in the range of 5 volts.

The programming of an erased EEPROM cell consists in making the electrons leave the floating gate 10. To this end, the control gate is grounded and the drain zone is taken to a highly positive potential, in the range of 15 volts or more. The electrons trapped in the floating gate are then removed. The threshold voltage of the cell is reduced. Typically, the threshold voltage takes a value in the range of −2 volts. The reason for this negative threshold voltage is that, to be sure that the cell has been properly programmed, the programming operation is maintained for a period greater than the time necessary for the previously trapped electrons not to be made to leave. In doing so, free electrons that contribute to the electrical neutrality of the material of the floating gate are also made to leave. Thus, in a way, holes are brought.

It is in fact the difference in potential that is important, giving the direction of the electrical field and, hence, of the motion of the electrons. For the programming, it is also possible to place the control gate at a highly negative potential and to ground the drain zone: the difference in potential would be unchanged. However, in practice, it is not possible to put the control gate at a negative potential, for the control logic of the cells, which is attached to the integrated circuit, will always counter it.

In certain cases, it is possible to erase and program the cell in the same way, by using the source zone 4 instead of the drain zone 3, since these two zones are undifferentiated. This is the reason why, in the invention, a voltage limiter is placed on each source and drain zone.

It must be noted, furthermore, that it is possible to program the cell by exposing it to ultra-violet rays. This is possible only if its floating gate is not protected by an optical mask. This optical mask may be made, for example, in the form of a metal pad 12 superimposed on the integrated circuit.

If a voltage limiter 5, 6 respectively is placed on the drain zone 3, source zone 4 respectively, the electrical programming is prevented for it is no longer possible to apply a highly positive potential to these zones and it is not possible to apply a highly negative potential to the control gate, as has been seen further above. If, in addition, a metal pad 12 is placed on the control gate, the programming by ultra-violet radiation is prevented: we have a never-programmable EEPROM cell.

The description and the reasoning just made for an EEPROM cell with N type channel zone is applicable, in the same way, to an EEPROM cell with P type channel zone, in reversing the polarities and the type of charges.

The voltage limiter 5 or 6 respectively is, for example, a Zener diode made, as seen above, by the joining, to the drain zone 3, source zone 4 respectively, of a zone with opposite doping, 7 and 8 respectively, outside the channel zone 9. The zones 7 and 8 with opposite doping are connected to the ground. We obtain a reverse biased PN junction which can be shown to be a Zener diode, characterized by a Zener voltage having a value between 5 and 6 volts. For the practical making of the Zener diodes, we allow, for the doping implantation, a slight overlapping of the subseqiently doped zone (7 or 8) in the neighboring zone (3 or 4) doped beforehand with an opposite type of doping.

What is claimed is:

1. A device for preventing access to an integrated circuit comprising:
an EEPROM cell with a drain zone, a source zone, a floating gate and a control gate, the cell having a channel zone between the drain zone and the source zone, and a voltage limiter having one side connected to at least one of the drain zone and source zone, and having another side connected to a common ground connection of the integrated circuit, said EEPROM cell permitting access to said integrated circuit in its virgin programmed state, and said voltage limiter preventing said EEPROM cell from being programmed after it is erased by applying a voltage to the at least one of the drain zone and source zone.

2. A device according to claim 1, wherein the voltage limiter is a Zener diode comprising a grounded zone, said grounded zone having a first type doping, said grounded zone contacting a drain zone or source zone of said EEPROM cell and separated from said EEPROM channel zone, said drain or source zone having a second type doping, opposite to the first type of doping.

3. A device according to claim 1 or 2 comprising a metal pad on the control gate of the EEPROM cell to prohibit a programming of said cell by an application of an ultra-violet radiation.

4. A device according to claim 3, connected to an integrated circuit, controlling access to said integrated circuit.

* * * * *